US008253457B2

(12) United States Patent
Aremallapur

(10) Patent No.: US 8,253,457 B2
(45) Date of Patent: Aug. 28, 2012

(54) DELAY LOCKED LOOP WITH DELAY PROGRAMMABILITY

(75) Inventor: Nagalinga Swamy Basayya Aremallapur, Haveri (IN)

(73) Assignee: Texas Instruments Incorporated, Dallas, TX (US)

( * ) Notice: Subject to any disclaimer, the term of this patent is extended or adjusted under 35 U.S.C. 154(b) by 96 days.

(21) Appl. No.: 12/945,892

(22) Filed: Nov. 15, 2010

(65) Prior Publication Data

US 2012/0119802 A1 May 17, 2012

(51) Int. Cl.
*H03L 7/06* (2006.01)

(52) U.S. Cl. ......................... 327/156; 327/158; 327/161

(58) Field of Classification Search .................. 327/156, 327/158, 161

See application file for complete search history.

(56) References Cited

U.S. PATENT DOCUMENTS

| | | | | |
|---|---|---|---|---|
| 7,202,719 | B2 * | 4/2007 | Gabato et al. | 327/158 |
| 7,319,351 | B2 * | 1/2008 | Zhang et al. | 327/158 |

* cited by examiner

*Primary Examiner* — John Poos

(74) *Attorney, Agent, or Firm* — John R. Pessetto; W. James Brady; Frederick J. Telecky, Jr.

(57) ABSTRACT

A delay locked loop (DLL) with delay programmability includes a pair of delay blocks, each containing multiple delay elements, but configurable to connect a desired subset of the delay elements between input and output nodes of the respective delay blocks. The subsets of the delay elements in the two delay blocks are connected in series. The ratio of the number of delay elements programmed to form each of the two subsets determines a delay provided as an output by the DLL. In operation, a phase discriminator and a loop filter in combination with the programmed subsets in the delay blocks, operate to generate an analog error signal to compensate for process, temperature and voltage (PTV) variations in the delay provided as an output by the DLL.

15 Claims, 3 Drawing Sheets

DELAY LOCKED LOOP WITH DELAY PROGRAMMABILITY

BACKGROUND

1. Technical Field

Embodiments of the present disclosure relate generally to delay line circuits, and more specifically to a delay locked loop with delay programmability.

2. Related Art

A delay locked loop (DLL) refers to a closed-loop feedback circuit that adjusts the phase of its output to achieve a desired phase difference between the output and an input signal. The adjustment is typically done based on an error signal generated as a comparison result of the phases of the output and the input signal. The input signal is typically a clock signal, a data stream or other periodic signal, while the output is typically a clock signal.

The phase difference between the output of a DLL and the input signal is termed as the 'delay' provided by the DLL. Delay programmability refers to a capability by which the delay provided by the DLL can be specified as an input value or otherwise be set in the DLL. The input specifying the delay may be provided, for example, as a "delay value" by an external device (e.g., by a processor external to the DLL). Alternatively, the desired delay may be obtained by activating one or more control signals provided as inputs to the DLL.

SUMMARY

This Summary is provided to comply with 37 C.F.R. §1.73, requiring a summary of the invention briefly indicating the nature and substance of the invention. It is submitted with the understanding that it will not be used to interpret or limit the scope or meaning of the claims.

A delay locked loop (DLL) receives an input signal on an input node and provides a delayed signal representing the input signal with a delay on an output node. The DLL contains a pair of delay blocks, each containing multiple delay elements, but configurable to connect only a subset of the delay elements between their respective input and output nodes. The input node and the output node of a first one of the delay blocks correspond respectively to the input node on which the input signal is received and the output node on which the delayed signal is generated. The respective input and output nodes of the delay blocks are connected such that the subset of delay elements in one delay block is connected in series with the subset of delay elements in the other delay block. The DLL includes a phase discriminator to receive the input signal and the output of the second one of the delay blocks, and operates to generate an error signal representing the phase difference between the phase of the input signal and the output of the second one of the delay blocks. The error signal (or a signal derived from the error signal) is fed back as a control signal to each delay element in the corresponding subsets of delay elements in the delay blocks to control a delay provided by the corresponding delay element.

Several embodiments of the present disclosure are described below with reference to examples for illustration. It should be understood that numerous specific details, relationships, and methods are set forth to provide a full understanding of the embodiments. One skilled in the relevant art, however, will readily recognize that the techniques can be practiced without one or more of the specific details, or with other methods, etc.

BRIEF DESCRIPTION OF THE VIEWS OF DRAWINGS

The drawing in which an element first appears is indicated by the leftmost digit(s) in the corresponding reference number.

DETAILED DESCRIPTION

Various embodiments are described below with several examples for illustration.

1. Example Device/System

Figure 1:
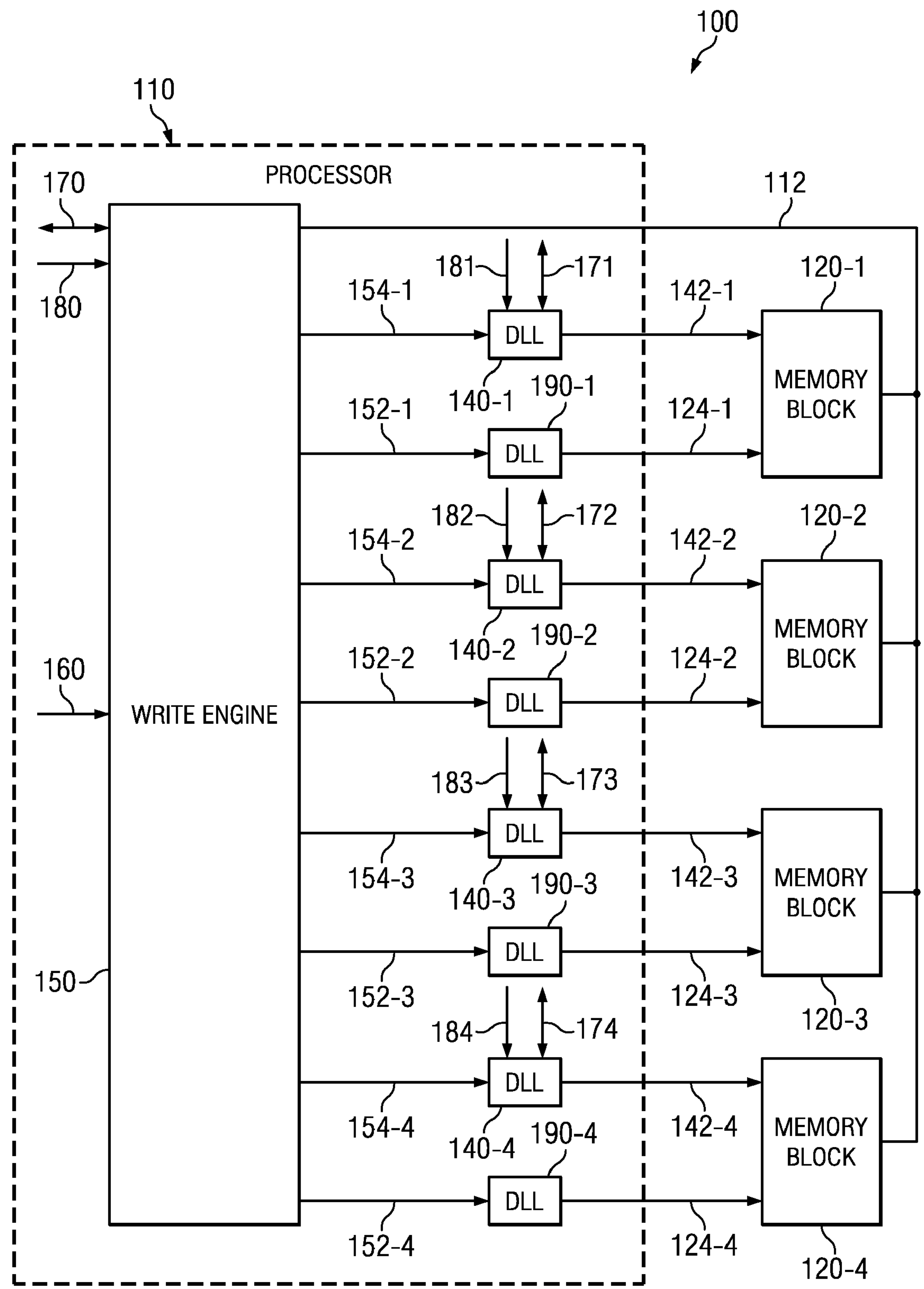
FIG. 1 is a block diagram of an example device or system in which several embodiments can be implemented.

FIG. 1 is a block diagram illustrating an example device or system in which several embodiments can be implemented. Device 100 is shown containing application processor 110, and memory devices 120-1 through 120-4. The components and blocks of FIG. 1 are shown merely by way of illustration. Real-world environments may contain more components/blocks. Further, while the description below is provided in the context of an interface between a processor and memory devices, embodiments of the present disclosure can be deployed in other environments as well. Device 100 may correspond, for example, to a computing device or motherboard of a general purpose computer. Device 100 may correspond to a special purpose electronic device as well.

Processor 110 may represent an application specific integrated circuit (ASIC), and may contain multiple logic blocks, although only write engine 150 and delay locked loops (DLL) 140-1 through 140-4 are shown contained in processor 110. Write engine 150 may be viewed as one of the logic blocks.

Write engine 150 receives 32-bit-wide data on path 160 from a logic unit (not shown) within processor 110. Write engine 150 forwards respective 8-bit data (the corresponding data byte in the 32-bit data received on path 160) on the respective ones of data paths 152-1, 152-2, 152-3 and 152-4. Each of data paths 152-1, 152-2, 152-3 and 152-4 is assumed to be eight bits wide. Write engine 150 generates strobe signals on paths 154-1, 154-2, 154-3 and 154-4 to indicate validity of data on data paths 152-1, 152-2, 152-3 and 152-4 respectively, consistent with Dual-Data-Rate 3 (DDR3) specifications.

Write engine 150 generates a master clock on path 112. The clock on path 112 is provided as an input to each of memory blocks 120-1 through 120-4. Clock 112 may also be used to synchronize and co-ordinate operations within processor 110. Write engine 150 may also generate various other signals consistent with a memory write operation as specified by the DDR3 specification, but not shown in FIG. 1. Also consistent with DDR3 specifications, each of the data on data paths 152-1, 152-2, 152-3 and 152-4, as well as strobe signals on paths 154-1, 154-2, 154-3 and 154-4 may need to be aligned with respect to master clock 112.

Delay locked loops (DLL) 140-1, 140-2, 140-3 and 140-4 receive respective strobe signals 154-1, 154-2, 154-3 and 154-4, and forward the respective strobe signals with a desired delay (determined as described below) on respective paths 142-1, 142-2, 142-3 and 142-4. The desired delay provided by each of DLLs 140-1, 140-2, 140-3 and 140-4 may be set by write engine 150 via respective bidirectional paths 171, 172, 173 and 174. Each of paths 171, 172, 173 and 174 may contain multiple paths, both input and output. In an embodiment, each of the paths contains all external connections of a delay block, as described below. Path 170 is deemed to contain paths 171, 172, 173 and 174.

Delay locked loops (DLL) 190-1, 190-2, 190-3 and 190-4 receive respective data signals 152-1, 152-2, 152-3 and 152-4, and forward the respective data signals with a desired delay (determined as described below) on respective paths 124-1, 124-2, 124-3 and 124-4. The desired delay provided by each of DLLs 190-1, 190-2, 190-3 and 190-4 may be set by write engine 150 via corresponding paths, not shown. DLLs 190-1 through 190-4 also receive bias voltages (similar to those provided to DLLs 140-1 through 140-4 via paths 181 through 184) via corresponding paths, not shown.

DLLs 140-1, 140-2, 140-3 and 140-4 receive respective bias voltages on paths 181, 182, 183 and 184 during programming, as described below. Path 180 is deemed to contain paths 181, 182, 183 and 184. Write engine 150 may contain bias circuits or voltage references to generate the bias voltages on paths 181 through 184. Alternatively, bias voltages 181, 182, 183 and 184 may be provided by bias circuits external to write engine 150 but under control of write engine 150. Such bias circuits may also be contained within the respective DLLs themselves. DLLs 190-1, 190-2, 190-3 and 190-4 also receive respective bias voltages, although the corresponding paths and connections are not shown in FIG. 1 in the interest of clarity.

Memory blocks 120-1, 120-2, 120-3 and 120-4 represent memory components implemented according to the DDR3 (Dual Data Rate 3) fly-by topology specifications. Memory block 120-1 receives strobe signal 124-1 and data signals on path 142-1. Memory block 120-2 receives strobe signal 124-2 and data signals on path 142-2. Memory block 120-3 receives strobe signal 124-3 and data signals on path 142-3. Memory block 120-4 receives strobe signal 124-4 and data signals on path 142-4.

Each of memory blocks 120-1 through 120-4 receives clock 112 and synchronizes its operation with respect to clock 112. One requirement specified by the DDR3 standard is that the edge of a strobe signal qualifying a write-data be aligned with an edge of clock 112 as received at the inputs of a memory device. To illustrate, edges of strobe signal 142-1, as received at memory block 120-1, need to be aligned (synchronous) with edges of clock 112 as received at memory block 120-1. There is a similar requirement with respect to each of the other memory blocks and the corresponding arrival times of the corresponding strobe signals and clock 112. Thus, as an example, edges of strobe signal 142-4 as received at memory block 120-4 need to be aligned with edges of clock 112 as received at memory block 120-4. Similarly, data transitions of data on each of data paths 124-1, 124-2, 124-3 and 124-4 may also have to meet setup and hold timing requirement with respect to edges of clock 112.

Processor 110 and memory blocks 120-1 through 120-4 may be mounted on a printed circuit board (PCB), with paths 112, 142-1 through 142-4 and 124-1 through 124-4 implemented as conducting traces on the PCB. As is well-known in the relevant arts, the propagation of signals through wires and PCB traces may be associated with delays. Thus, for example, even if strobe traces 142-1 through 142-4 are all of the same length, there may be a delay between edges of strobe 142-4 and clock 112, clock 112 having to travel a longer distance before it reaches memory block 120-4 than any of other memory blocks 120-1, 120-2 or 120-3. In general, it may be difficult to ensure zero delay with respect to clock 112 and each of the strobe signals 142-1 through 142-4. Similarly, it may be difficult to ensure that each of data signals 124-1 through 124-4 meets setup and hold timing with respect to edges of clock 112.

The DDR3 specification specifies a training sequence, in which a processor performs one or more data writes to a DDR3 memory. Corresponding to each data write, the DDR3 memory specifies to the processor whether the write is successful or not, thereby providing an indication of the delay with which the processor may need to delay a strobe signal with respect to a master clock signal. In an embodiment, during such a training sequence, write engine 150 of processor 110 determines the delay to be provided by each of DLLs 140-1 through 140-4 to ensure that each of strobe signals 142-1 through 142-4 is synchronous with master clock 112. Write engine 150 of processor 110 also determines the delay to be provided by each of DLLs 190-1 through 190-4 to ensure that each of data signals 124-1 through 124-4 meets required setup and hold specifications with respect to master clock 112. Write engine 150, thus, ensures that the strobe and data signals are suitably delayed to ensure correct write operations to the memory blocks.

It may be appreciated that the specific delay to be provided by each of DLLs 140-1 through 140-4 and 190-1 through 190-4 may vary from one PCB to another, between devices/systems (incorporating the components of FIG. 1), as well as due to timing variations in the components of FIG. 1 due to variations in process, temperature and voltage, i.e. due to PTV variations. Hence, it may be desirable to implement DLLs 140-1 through 140-4 as well as DLLs 190-1 through 190-4 to provide a delay that is programmable. The implementation details of a DLL with delay programmability in an embodiment are provided next.

2. Programmable Delay Locked Loop

Figure 2:
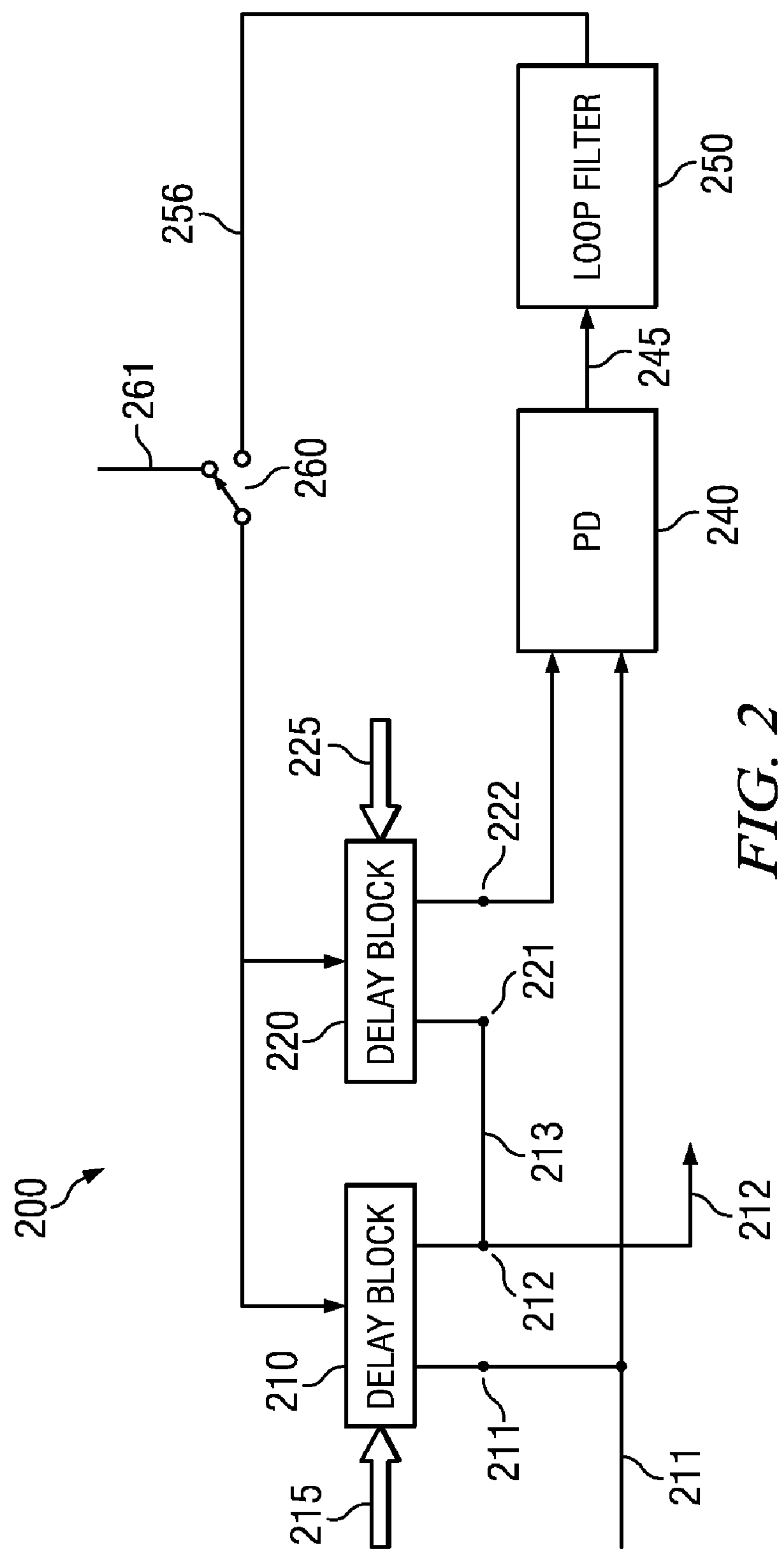
FIG. 2 is a block diagram of a DLL with delay programmability, in an embodiment.

FIG. 2 is a block diagram of a DLL with delay programmability, in an embodiment. DLL 200, which can be implemented in place of DLLs 140-1 through 140-4 and/or 190-1 through 190-4 of FIG. 1, is shown containing delay blocks 210 and 220, phase discriminator (also termed phase detector) 240, loop filter 250 and switch 260.

When DLL 200 is implemented in place of DLL 140-1, path 211 corresponds to path 154-1, path 212 corresponds to path 142-1, and path 181 corresponds to path 261, and paths 215 and 225 are included in path 171. A similar correspondence with respect to inputs and outputs exists when any of DLLs 140-2 through 140-4 and 190-1 through 190-4 is implemented as DLL 200.

Delay block 210 (first delay block) receives an input signal (e.g., a reference clock) on input node/path 211, and provides a corresponding delayed signal on output node/path 212. The delayed signal on output node 212 is also shown as being provided on output path 212. Similarly, the signal on path 211 is the same as the signal provided on node 211. Delay block 210 contains multiple delay cells, each in turn containing a delay element and a multiplexer. Delay block 210 receives a configuration value on path 215 specifying the number of delay cells that are to be connected between input node 211 and output node 212. In an embodiment, the configuration value is received as a thermometric code which serves to connect the corresponding (desired number of) delay elements between nodes 211 and 212, as described below with reference to FIG. 3. Thus, the number of units of delay that are to be provided by delay block 210 between nodes 211 and 212 is programmable via path 215. Path 215 may be viewed as being connected to delay block 210 at a configuration (or programming) port.

Delay block 220 (second delay block) contains an input node 221 and an output node 222. Input node 221 is connected to output node 212 of delay block 210 via path 213. Output node 222 is connected to an input of phase discriminator 240. Delay block 220 contains multiple delay cells, each in turn containing a delay element and a multiplexer. Delay block 220 receives a configuration value on path 225 specifying the number of delay cells that are to be connected between input node 221 and output node 222. In an embodiment, the configuration value is received as a thermometric code which serves to connect the corresponding (desired number of) delay elements between nodes 221 and 222, as described below with reference to FIG. 3. Thus, the number of units of delay that is to be provided by delay block 220 between nodes 221 and 222 is programmable via path 225. Path 225 may be viewed as being connected to delay block 220 at a configuration port.

From FIG. 2 and the description above, it may be observed that the delay elements programmed (or configured) to be connected between nodes 211 and 212 and the delay elements programmed to be connected between nodes 221 and 222 are in series. Hence, the delay provided at node 222 with respect to an input signal at node 211 equals the sum of the delays provided by delay block 210 and delay block 220.

Phase discriminator 240 receives input signal 211 and the signal on node 222 as inputs and generates an error signal on path 245. Error signal 245 is representative of the phase difference between signals 211 and signal 222. Phase discriminator 240 may be implemented using any of several well-known techniques, and may include, for example, a charge pump, although not shown in FIG. 2.

Loop filter 250 performs low-pass filtering of the error signal 245, and generates a filtered signal on path 256. Signal 256 is, thus, derived from error signal 245 and is an analog signal that may be used as a control signal to vary the delay provided by each of the delay elements deployed in delay blocks 210 and 220, i.e., to each of the delay elements connected between nodes 211 and 212, and nodes 221 and 222. Loop filter 250 may be implemented in a known way. During normal operation (functional mode) of DLL 200, switch 260 is connected to path 256, thereby enabling closed loop feedback control. When DLL 200 is being programmed, i.e., in a configuration mode (to set a desired value of delay between nodes 211 and 212), switch 260 is connected to path 261, as described in sections below. Path 261 receives a bias voltage. Switch 260 may be operated by a component external to DLL 200, for example, by write engine 150, to connect to a desired one of the paths 261 and 256.

In an embodiment, control signal 256 is used to vary the value of power supply voltage used to power each of the delay elements noted above. The feedback control via control signal 256 operates in closed-loop fashion to compensate for variations in the delay provided by each of the delay elements due to variations in process, temperature and operating power supply voltage, i.e., PTV variations. In other embodiments, closed-loop control using control signal 256 may be implemented according to other well-known techniques, such as, for example, current-starved inverter techniques.

The manner in which a desired delay, with respect to an input signal on path 211, is obtained at output node/path 212, is described below. However, the implementation details of delay blocks 210 and 220 are provided first.

3. Delay Block

Figure 3:
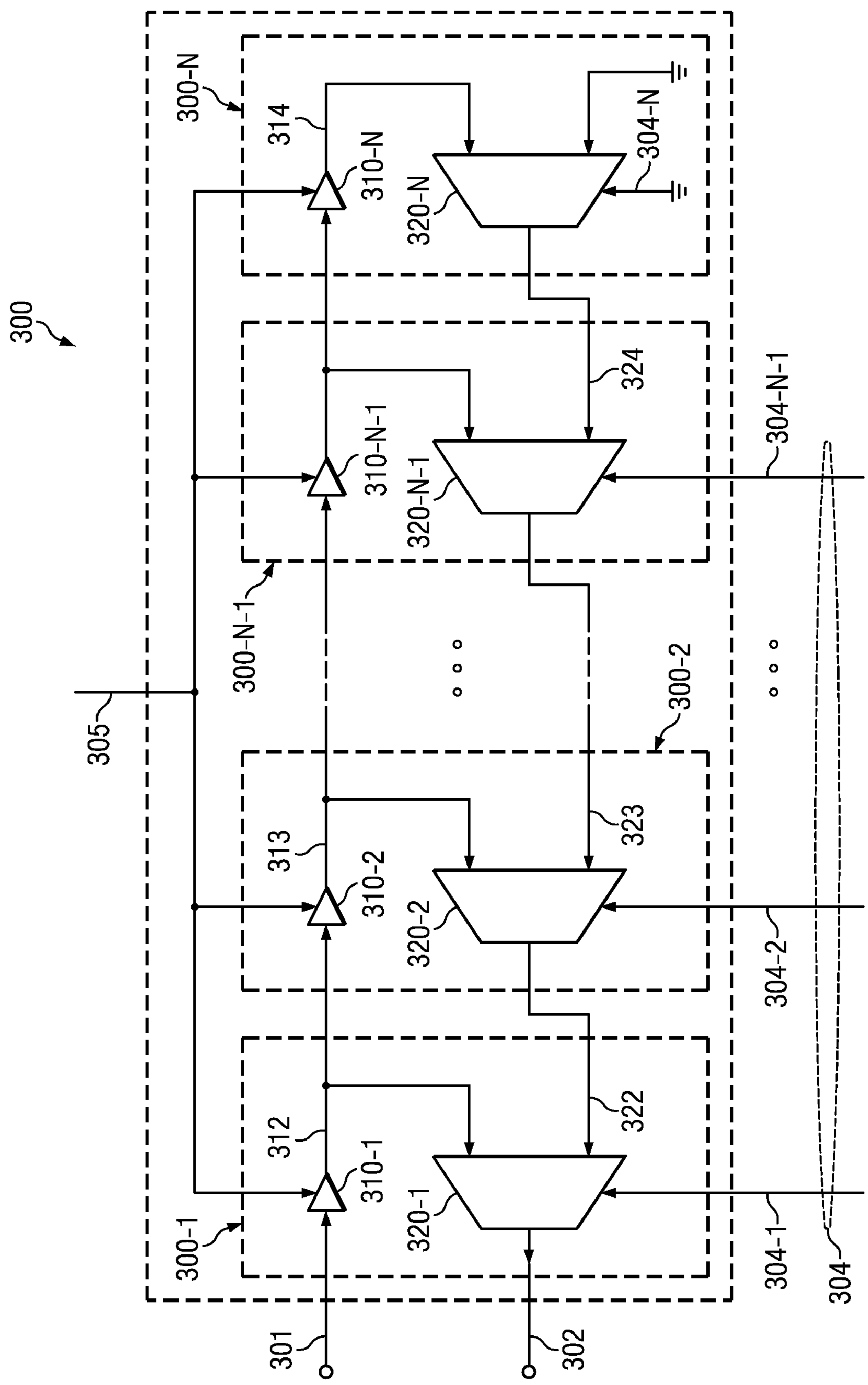
FIG. 3 is a block diagram illustrating the implementations details of a delay block used in a DLL in an embodiment.

FIG. 3 is a block diagram illustrating the implementation details of a delay block in an embodiment. Delay block 300, which may be implemented in place of delay blocks 210 and 220 of FIG. 2, is shown containing 'N' delay cells 300-1 through 300-N. Each delay cell contains a delay element and a multiplexer (MUX). Thus, delay cell 300-1 is shown containing delay element 310-1 and MUX 320-1. Similarly, delay cells 300-1, 300-N−1 and 300-N are respectively shown containing delay element 310-2 and MUX 320-2, delay element 310-N−1 and MUX 320-N−1, and delay element 310-N and MUX 320-N. The specific total number of delay cells contained in delay block 300 may be based on the resolution at which output 212 is sought to be provided, as well as other parameters such as the degree of control obtainable via feedback (control signal 256), minimum and maximum frequencies of clock 112, etc. Further, the number of delay cells may need to be selected to ensure that the number of delay elements selected for operation in a DLL are sufficient to generate a required delay for an operational range of values of clock frequency of clock 112, as well as process, temperature and voltage (PTV) variations. When delay block 210 (FIG. 2) is implemented as delay block 300, delay elements 310-1 through 310-N represent a first plurality of delay elements. When delay block 220 (FIG. 2) is implemented as delay block 300, delay elements 310-1 through 310-N represent a second plurality of delay elements.

Delay block 300 receives an input signal on input node 301, and provides the input signal with a desired delay on output node 302. Delay elements in each delay cell (300-1 through 300-N) receive a control signal on path 305 to control the amount of delay provided by the delay element. As noted above, control signal 305 may be designed to vary the power supply voltage (connections not shown in FIG. 3) provided to each of the delay elements, to enable variation in the delay. Typically, a larger value of power supply voltage to a delay element results in a smaller delay, and vice versa.

Each of multiplexers 320-1 through 320-N (in respective delay cells 300-1 through 300-N−1) receives a select input (on respective ones of paths 304-1 through 304-N−1). Select paths 304-1 through 304-N−1 are together referred to as path 304. A select input determines which one of the two inputs to a multiplexer is provided as the output. Thus, MUX 320-1 provides the signal on path 312 on output node 302 if select signal 304-1 is at one binary value, and the signal on path 322 on output node 302 otherwise. Similarly, MUX 320-2 provides the signal on path 313 on path 322 if select signal 304-2 is at one binary value, and the signal on path 323 on path 322 otherwise. Delay cell 300-N represents the 'last' delay cell in delay block 300. Select input 304-N of MUX 320-N is hardwired (shown connected to ground in FIG. 3) to permanently select output 314 of delay element 310-N as the output (path 324) of MUX 320-N. The other input to MUX 320-N is connected to ground terminal.

The number of delay elements that are connected between nodes 301 and 302 is programmable via select signal 304. In an embodiment, a thermometric code is provided on path 304 to select the number of delay elements between nodes 301 and 302.

Delay block 300 may be implemented in place of delay block 210 and delay block 220 of FIG. 2. Node 301 of delay block 300 corresponds to node 211 of delay block 210 and node 221 of delay block 220. Node 302 of delay block 300 corresponds to node 212 of delay block 210 and node 222 of delay block 220. Control input 305 of delay block 300 corresponds to control input 256 of delay blocks 210 and 220. Select input 304 of delay block 300 corresponds to paths 215 and 225 connected respectively to delay blocks 210 and 220.

DLL 200 of FIG. 2, thus implemented, can be programmed to provide a desired delay at output node 212 with respect to an input signal (e.g., a reference clock) received on path/node 211. Thus, with reference to FIG. 1 for example, write engine 150 may program each of DLLs 140-1 through 140-4 via path 170. Write engine 150 may also program DLLs 190-1 through 190-4 via corresponding paths, not shown.

As noted above with respect to FIG. 1, each of paths 171, 172, 173 and 174 may contain multiple paths, both input and output. In an embodiment, each of the paths contains all external connections of a delay block. To illustrate, assuming DLL 140-1 is implemented using DLL 200 of FIG. 2, path 154-1 (of FIG. 1) corresponds to path 211 (of FIG. 2), path 142-1 corresponds to path 212, and path 261 corresponds to path 181. Path 171 includes paths 215, 225, 212 and 222. However, paths 142-1 (equivalent to path 212) and 171 are not shown connected with each other in FIG. 1, in the interest of clarity. Similar connections corresponding to DLLs 140-2, 140-3 and 140-4 are also not shown in FIG. 1. Control signals for operation of switches (similar to switch 260 of FIG. 2) in DLLs 140-1 through 140-4 are not shown, but are assumed to be provided by write engine 150.

The manner in which a desired delay is programmed in a DLL in an embodiment is described next.

4. Programming a Desired Delay

The description below is provided with reference to FIGS. 1, 2 and 3, and assuming that write engine 150 needs to program DLL 140-1, implemented as DLL 200 of FIG. 2. DLLs 140-2 through 140-4 and 190-1 through 190-4 may be programmed in a similar manner by write engine 150. The programming (or calibration) operation described below is typically performed at power-ON (initialization of the various blocks in processor 110 and/or the device in which processor 110 is implemented), although such programming can be performed on-the-fly as well.

Initially, write engine 150 sets the position of switch 260 to connect to path 261. Write engine 150 provides a bias voltage on path 261 to a value that is mid-way between the minimum and maximum values of the control signal provided on path 256 during normal operation. With the bias voltage provided to all the delay elements in delay blocks 210 and 220 set as noted above, write engine 150 determines the total number of delay elements (sum of delay elements in delay block 210 and delay block 220) required to provide one cycle (360 degrees) of delay at node 222 with respect to the phase of a clock signal provided as input on path 211. Write engine 150 may make a determination of whether one cycle of delay is achieved or not by comparing signal on path 211 with the signal on path 222. It is noted that 360 degrees of delay also corresponds to zero phase difference between the signals at nodes 211 and 222.

Write engine 150 may perform the determination of the total number of delay elements for providing one cycle of delay in an incremental manner. Thus, for example, write engine 150 may initially program each of delay blocks 210 and 220 to connect one delay element each between nodes 211 and 212, and nodes 221 and 222. Write engine 150 may then compare the phases of signals 211 and 222. If the phase difference is not equal to 360 degrees, write engine 150 may add delay elements between one or both of node-pairs (211, 212) and (221, 222). Write engine 150 continues to add delay elements and determine the phase difference corresponding to each setting in an iterative manner, till a phase difference of 360 degree is obtained. Alternatively, the procedure for determining the number of delay elements required to provide 360 degrees phase difference between node 211 and 222 may be performed by DLL 200 itself, without requiring the intervention of write engine 150.

Write engine 150 then programs each of delay blocks 210 and 220 to obtain the desired delay at node/path 212. Assuming that the total number of delay elements determined as providing 360 degrees of delay equals the number 'N', and the desired delay (or phase difference with respect to input on node 211) at output node 212 is 'D' (first delay), write engine 150 computes the number of delay elements 'x1' (first subset of delay elements) to be programmed in delay block 210 (i.e., to be connected between nodes 211 and 212) according to the following equation:

$$x1=(D*N)/360 \quad \text{Equation 1}$$

Write engine 150 computes the number of delay elements 'x2' (second subset of delay elements) to be programmed in delay block 220 (i.e., to be connected between nodes 221 and 222) according to the following equation:

$$x2=N-x1 \quad \text{Equation 2}$$

Write engine 150 writes the values equaling to x1 (first configuration value) and x2 (second configuration value) in thermometric code on respective inputs 215 and 225. The value of x1 is less than or equal to the total number of delay elements in delay block 210, and the value of x2 is less than or equal to the total number of delay elements in delay block 220.

To illustrate with an example, assuming that the desired delay 'D' on output node 212 corresponds to a phase difference of 36 degrees (i.e., output 212 is to be provided delayed by 36 degrees with respect to signal 211), and the total number of elements 'N' determined to be required for one-cycle (360 degree) delay is 100, then number x1 of equation 1 equals 10, and x2 of equation 2 equals 90. Write engine 150 would, therefore, send a configuration value equaling 10 on path 215 and another configuration value equaling 90 on path 225.

After programming the configuration values, write engine 150 sets switch 260 to connect to path 256, and DLL 200 starts normal operation as a closed-loop feedback circuit, with control signal 256 controlling the delay provided by each of the programmed delay elements to compensate for variations in the programmed value of 36 degrees at output node 212 due to process, temperature and voltage (PTV) variations, and thus to maintain the desired delay at output node 212 at 36 degrees.

While the description above is provided in the context of data-writes to memory blocks 120-1 through 120-4, a similar requirement for delaying strobe signals generated by the memory blocks may be required when processor 110 reads data from the memory blocks. Techniques similar to those noted above may be employed for such memory reads as well, as would be apparent to one skilled in the relevant arts upon reading the disclosure herein.

In the illustrations of FIGS. 1, 2 and 3, although terminals/nodes are shown with direct connections to various other terminals, it should be appreciated that additional components (as suited for the specific environment) may also be present in the path, and accordingly the connections may be viewed as being electrically coupled to the same connected terminals.

While various embodiments of the present disclosure have been described above, it should be understood that they have been presented by way of example only, and not limitation. Thus, the breadth and scope of the present disclosure should not be limited by any of the above-described embodiments, but should be defined only in accordance with the following claims and their equivalents.

What is claimed is:

1. A delay locked loop (DLL) comprising:

a first delay block comprising a first plurality of delay elements, but configurable to couple only a first subset of delay elements in the first plurality of delay elements between a first input node and a first output node of the first delay block, wherein the first input node and the first output node respectively represent an input terminal and an output terminal of the DLL, wherein the DLL is coupled to receive an input signal on the input terminal, the DLL to generate a first delayed signal with a first delay with respect to the input signal on the output terminal;

a second delay block comprising a second plurality of delay elements, but configurable to couple only a second subset of delay elements in the second plurality of delay elements between a second input node and a second output node of the second delay block, wherein the second input node is coupled to the first output node to couple the first subset of delay elements and the second subset of delay elements in series, wherein the second delay block provides a second delayed signal on the second output node; and a phase discriminator coupled to receive the input signal and the second delayed signal as inputs, and to generate an error signal representing a phase difference between a phase of the input signal and a phase of the second delayed signal, wherein a control signal derived from the error signal is coupled to each delay element in the first subset of delay elements and the second subset of delay elements to control a delay provided by the corresponding delay element;

wherein the first delay block receives a first configuration value from a component external to the DLL, wherein the number of delay elements in the first subset of delay elements equals the first configuration value, wherein the second delay block receives a second configuration value from the component external to the DLL, wherein the number of delay elements in the second subset of delay elements equals the second configuration value, wherein the first configuration value and the second configuration value are selected to provide the first delayed signal with the first delay on the first output node.

2. The DLL of claim 1, wherein each delay element in the first plurality of delay elements and the second plurality of delay elements is comprised in a delay cell, wherein the delay cell comprises:

a first delay element;

and a multiplexer, wherein the multiplexer receives an output of the first delay element and an output of a second delay element of another delay cell as inputs, the multiplexer providing one of the output of the first delay element and the output of the second delay element as an output of the delay cell based on the value of a select signal, wherein the select signal is comprised in one of the first configuration value and the second configuration value.

3. The DLL of claim 2, wherein the DLL is operable in one of a configuration mode and a functional mode, the DLL further comprising a switch, wherein the switch decouples the control signal from each delay element in the first subset of delay elements and the second subset of delay elements in the configuration mode, and instead couples a bias voltage to each delay element in the first subset of delay elements and the second subset of delay elements in the configuration mode.

4. The DLL of claim 3, wherein the number of delay elements (x1) comprising the first subset is computed according to the equation:

$$x1=(D*N)/360,$$

wherein D represents the desired phase delay between the input signal and the first delayed signal, and N represents the total number of delay elements that provide a delay, with respect to the input signal at the second output node, equaling one period of the input signal.

5. The DLL of claim 4, wherein the number of delay elements (x2) comprising the second subset is computed according to the equation:

$$x2=N-x1.$$

6. An integrated circuit (IC) comprising:

a logic block to generate data to be written to an external memory, the logic block to also generate a strobe signal specifying a start of the data, and a master clock, wherein the master clock is provided to the external memory, the external memory synchronizing its operations with an edge of the master clock; and a plurality of delay locked loops (DLL) including a first DLL, wherein the first DLL comprises:

a first delay block configurable to couple a first subset of delay elements between a first node and a second node of the first delay block, the first delay block to receive the strobe signal on the first node and to generate the delayed strobe signal on the second node, wherein the delayed strobe signal is synchronous with an edge of the master clock;

a second delay block configurable to couple a second subset of delay elements between a third node and a fourth node of the second delay block, the second delay block to receive the delayed strobe signal on the third node and to generate a second delayed signal on the fourth node;

a phase discriminator coupled to receive the strobe signal and the second delayed signal as inputs and to generate an error signal representing a phase difference between a phase of the strobe signal and a phase of the second delayed signal; and a loop filter to low-pass filter the error signal to generate a filtered analog signal, wherein the filtered analog signal is coupled to control a delay provided by each delay element in the first subset of delay elements and the second subset of delay elements, wherein a ratio of the first subset of delay elements to the second subset of delay elements determines a delay value by which a phase of the delayed strobe signal is delayed with respect to a phase of the strobe signal.

7. The IC of claim 6, wherein the first delay block receives a first configuration value from the logic block, wherein the first subset of delay elements equals the first configuration value, and wherein the second delay block receives a second configuration value from the logic block, wherein the second subset of delay elements equals the second configuration value.

8. The IC of claim 7, wherein each delay element in the first subset of delay elements and the second subset of delay elements is comprised in a delay cell, wherein the delay cell comprises:

a first delay element;

and a multiplexer, wherein the multiplexer receives an output of the first delay element and an output of a second delay element of another delay cell as inputs, the multiplexer providing one of the output of the first delay element and the output of the second delay element as an output of the delay cell based on the value of a select signal, wherein the select signal is comprised in one the first configuration value and the second configuration value.

9. The IC of claim 8, wherein the first DLL is operable in one of a configuration mode and a functional mode, the first DLL further comprising a switch, wherein the switch decouples the filtered analog signal from each delay element in the first subset of delay elements and the second subset of delay elements in the configuration mode, and instead couples a bias voltage to each delay element in the first subset of delay elements and the second subset of delay elements in the configuration mode.

10. The IC of claim 9, wherein the number of delay elements (x1) comprising the first subset is computed according to the equation:

$$x1=(D*N)/360,$$

wherein D represents the desired phase delay between the strobe signal and the delayed strobe signal, and N represents the total number of delay elements that provide a delay, at the fourth node, equaling one period of the strobe signal.

11. The IC of claim 10, wherein the number of delay elements (x2) comprising the second subset is computed according to the equation:

$$x2=N-x1.$$

12. A device comprising:

a memory block, and a processor for reading data from and writing data to the memory block, operations performed by the memory block being synchronized with respect to a master clock generated by the processor, wherein the processor generates a strobe signal specifying a start of a data to be written to the memory block, the processor comprising a delay locked loop (DLL) to receive the strobe signal as an input signal on a first input node and to provide a delayed strobe signal as a first delayed signal representing the input signal with a first delay on a first output node, the DLL comprising:

a first delay block comprising a first plurality of delay elements, but configurable to couple only a first subset of delay elements between the first input node and the first output node;

a second delay block comprising a second plurality of delay elements, but configurable to couple only a second subset of delay elements between a second input node and a second output node of the second delay block, wherein the second input node is connected to the first output node such that the first subset of delay elements and the second subset of delay elements are coupled in series, wherein the second delay block provides a second delayed signal on the second output node;

a phase discriminator coupled to receive the input signal and the second delayed signal as inputs and to generate an error signal representing a phase difference between a phase of the input signal and a phase of the second delayed signal;

a loop filter to low-pass filter the error signal to generate a filtered analog signal; and a switch to couple the filtered analog signal to each delay element in the first subset of delay elements and the second subset of delay elements, the filtered analog signal to control a delay provided by the corresponding delay element.

13. The device of claim 12, wherein the DLL is operable in one of a configuration mode and a functional mode, wherein the processor is operable, in the configuration mode of the DLL, to:

determine a total number of delay elements (N) required to be coupled in series between the first input node and the second output node to generate a phase delay of three hundred and sixty degrees between the input signal and second delayed signal;

determine a delay value (D) to be generated for the first delayed signal with respect to the input signal;

write a configuration value of x1 at a configuration port of the first delay block, wherein the value of x1 is specified by the equation [x1=(D*N)/360]; and write a configuration value of x2 at a configuration port of the second delay block, wherein the value of x2 is specified by the equation [x2=N−x1], wherein the processor determines the total number (N) prior to writing the configuration value x1 and the configuration value x2.

14. The device of claim 13, wherein the memory block is designed according to Dual Data Rate 3 (DDR3) specifications.

15. The device of claim 14, wherein the processor, prior to commencing determination of the total number of delay elements (N), controls the switch to decouple the filtered analog signal from each delay element in the first subset of delay elements and the second subset of delay element, and instead couples a bias voltage to each delay element in the first subset of delay elements and the second subset of delay elements in the configuration mode, wherein the processor sets the value of the bias voltage with a value that is mid-way between the minimum and maximum values of the filtered analog signal in the functional mode.

* * * * *